US008568001B2

(12) United States Patent
Daily et al.

(10) Patent No.: US 8,568,001 B2
(45) Date of Patent: Oct. 29, 2013

(54) LED SOCKET ASSEMBLY (75) Inventors: Christopher George Daily, Harrisburg, PA (US); Matthew Edward Mostoller, Hummelstown, PA (US); Ronald Martin Weber, Annville, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 33 days.

(21) Appl. No.: 13/365,801

(22) Filed: Feb. 3, 2012

(65) Prior Publication Data

US 2013/0201701 A1      Aug. 8, 2013

(51) Int. Cl.
F21V 21/00 (2006.01)
F21V 21/08 (2006.01)

(52) U.S. Cl.
USPC ............................................ 362/396; 439/56

(58) Field of Classification Search
USPC ................. 362/396, 646, 647, 656, 655, 364; 257/99; 439/56, 701, 366, 558
See application file for complete search history.

(56) References Cited

U.S. PATENT DOCUMENTS

| | | | |
|---|---|---|---|
| 5,038,255 A | 8/1991 | Nishihashi et al. |
| 5,283,716 A | 2/1994 | Banitt et al. |
| 5,404,282 A | 4/1995 | Klinke et al. |
| 5,660,461 A | 8/1997 | Ignatius et al. |
| 6,318,886 B1 | 11/2001 | Stopa et al. |
| 6,541,800 B2 | 4/2003 | Barnett et al. |
| 6,667,544 B1 | 12/2003 | Glenn |
| 6,817,735 B2 | 11/2004 | Shimizu et al. |
| 6,911,731 B2 | 6/2005 | Wu |
| 6,999,318 B2 | 2/2006 | Newby |
| 7,306,353 B2 | 12/2007 | Popovich et al. |
| 7,322,718 B2 | 1/2008 | Setomoto et al. |
| 7,348,604 B2 | 3/2008 | Matheson |
| 7,400,029 B2 | 7/2008 | Shimada et al. |
| 7,540,761 B2 | 6/2009 | Weber et al. |
| 7,549,786 B2 | 6/2009 | Higley et al. |
| 7,553,162 B2 | 6/2009 | Isoda et al. |
| 7,952,114 B2 * | 5/2011 | Gingrich, III .................. 257/99 |
| 2002/0113244 A1 | 8/2002 | Barnett et al. |
| 2002/0114155 A1 | 8/2002 | Katogi et al. |
| 2002/0176250 A1 | 11/2002 | Bohler et al. |
| 2003/0063463 A1 | 4/2003 | Sloan et al. |
| 2003/0094893 A1 | 5/2003 | Ellens et al. |
| 2003/0112627 A1 | 6/2003 | Deese |
| 2003/0189829 A1 | 10/2003 | Shimizu et al. |

(Continued)

FOREIGN PATENT DOCUMENTS

| | | |
|---|---|---|
| DE | 19818402 | 10/1999 |
| DE | 10319525 | 11/2004 |
| EP | 1098135 | 5/2001 |
| WO | WO 0173844 | 10/2001 |

Primary Examiner — Mariceli Santiago
Assistant Examiner — Glenn Zimmerman (57) ABSTRACT A socket assembly includes a light emitting diode (LED) package having an LED printed circuit board (PCB) with an LED mounted thereto. The socket assembly also includes a clamp for holding the LED package to a support structure. The clamp includes a base that is configured to be mounted to the support structure such that the base engages the support structure. The clamp also includes a spring finger that extends from the base such that the base and the spring finger define a unitary body of the clamp. The spring finger is configured to engage the LED PCB of the LED package and apply a clamping force to the LED PCB that acts in a direction toward the support structure.

18 Claims, 7 Drawing Sheets

(56) References Cited

U.S. PATENT DOCUMENTS

| | | |
|---|---|---|
| 2004/0175189 A1 | 9/2004 | Weber-Rabsilber et al. |
| 2004/0252501 A1 | 12/2004 | Moriyama et al. |
| 2004/0264195 A1 | 12/2004 | Chang et al. |
| 2005/0152146 A1 | 7/2005 | Owen et al. |
| 2005/0243558 A1 | 11/2005 | Van Duyn |
| 2006/0091410 A1 | 5/2006 | Chen |
| 2006/0262533 A1 | 11/2006 | Lin et al. |
| 2007/0025103 A1 | 2/2007 | Chan |
| 2007/0246712 A1 | 10/2007 | Kim et al. |
| 2008/0220631 A1 | 9/2008 | Isoda et al. |
| 2008/0224166 A1* | 9/2008 | Glovatsky et al. .............. 257/99 |
| 2008/0315214 A1 | 12/2008 | Wall, Jr. et al. |
| 2009/0009103 A1 | 1/2009 | McKechnie et al. |
| 2009/0009998 A1 | 1/2009 | Malstrom et al. |
| 2009/0108281 A1 | 4/2009 | Keller et al. |
| 2009/0130889 A1 | 5/2009 | Daily et al. |
| 2009/0146919 A1 | 6/2009 | Kline et al. |
| 2009/0191725 A1* | 7/2009 | Vogt et al. ...................... 439/56 |
| 2010/0314655 A1* | 12/2010 | Thompson ...................... 257/99 |
| 2010/0315813 A1* | 12/2010 | Fugerer et al. ................. 362/235 |
| 2011/0136394 A1* | 6/2011 | Mostoller et al. .............. 439/701 |
| 2013/0044501 A1* | 2/2013 | Rudisill et al. ................. 362/398 |
| 2013/0069103 A1* | 3/2013 | Thompson ...................... 257/99 |

\* cited by examiner

LED SOCKET ASSEMBLY

BACKGROUND OF THE INVENTION

The subject matter described and/or illustrated herein relates generally to light emitting diode (LED) lighting systems.

LED lighting systems typically include one or more LED packages that include one or more LEDs on a printed circuit board (PCB), which is referred to herein as an "LED PCB". The LED packages may be what is commonly referred to as a "chip-on-board" (COB) LED, or may be any other type of LED package, such as, but not limited to, an LED package that includes an LED PCB and one or more LEDs soldered to the LED PCB.

In known LED lighting systems, the LED package is held within a recess of a socket housing that is mounted to a support structure of the lighting fixture, for example a base, a heat sink, and/or the like. When the LED package is held by the socket housing, the socket housing may apply a force to the LED package to press the LED package toward the support structure. For example, the force applied by the socket housing may hold the LED PCB in engagement with the support structure or a thermal interface material that extends between the LED PCB and the support structure. But, the force applied by the socket housing to the LED package may cause the LED package to fail. For example, the force applied to the LED package by the socket housing may be sufficiently high to fracture (e.g., crack, break, and/or the like) the LED PCB. Moreover, and for example, the force applied by the socket housing to the LED package may be insufficient to securely hold the LED package between the socket housing and the support structure, which may allow the LED package to vibrate and thereby fracture or otherwise fail.

BRIEF DESCRIPTION OF THE INVENTION

In one embodiment, a socket assembly includes a light emitting diode (LED) package having an LED printed circuit board (PCB) with an LED mounted thereto. The socket assembly also includes a clamp for holding the LED package to a support structure. The clamp includes a base that is configured to be mounted to the support structure such that the base engages the support structure. The clamp also includes a spring finger that extends from the base such that the base and the spring finger define a unitary body of the clamp. The spring finger is configured to engage the LED PCB of the LED package and apply a clamping force to the LED PCB that acts in a direction toward the support structure.

In another embodiment, a socket assembly is provided for light emitting diode (LED) packages having an LED printed circuit board (PCB). The socket assembly includes a housing having a recess that is configured to receive an LED package therein. The housing is configured to be mounted to a support structure. The socket assembly includes a clamp having a base that is configured to be mounted to the support structure such that the base engages the support structure. The clamp further includes a spring finger that extends from the base. The spring finger is configured to engage the LED PCB of the LED package and apply a clamping force to the LED PCB that acts in a direction toward the support structure to clamp the LED PCB between the spring finger and the support structure independent of the housing being mounted to the support structure.

In another embodiment, a lighting assembly includes a support structure having a mounting surface, and a socket assembly. The socket assembly includes a light emitting diode (LED) package having an LED printed circuit board (PCB) with an LED mounted thereto. The socket assembly also includes a clamp for holding the LED package to the support structure. The clamp has a base that is configured to be mounted to the support structure such that the base engages the mounting surface of the support structure. The clamp also includes a spring finger that extends from the base such that the base and the spring finger define a unitary body of the clamp. The spring finger is configured to engage the LED PCB of the LED package and apply a clamping force to the LED PCB that acts in a direction toward the mounting surface of the support structure.

DETAILED DESCRIPTION OF THE INVENTION

Figure 1:
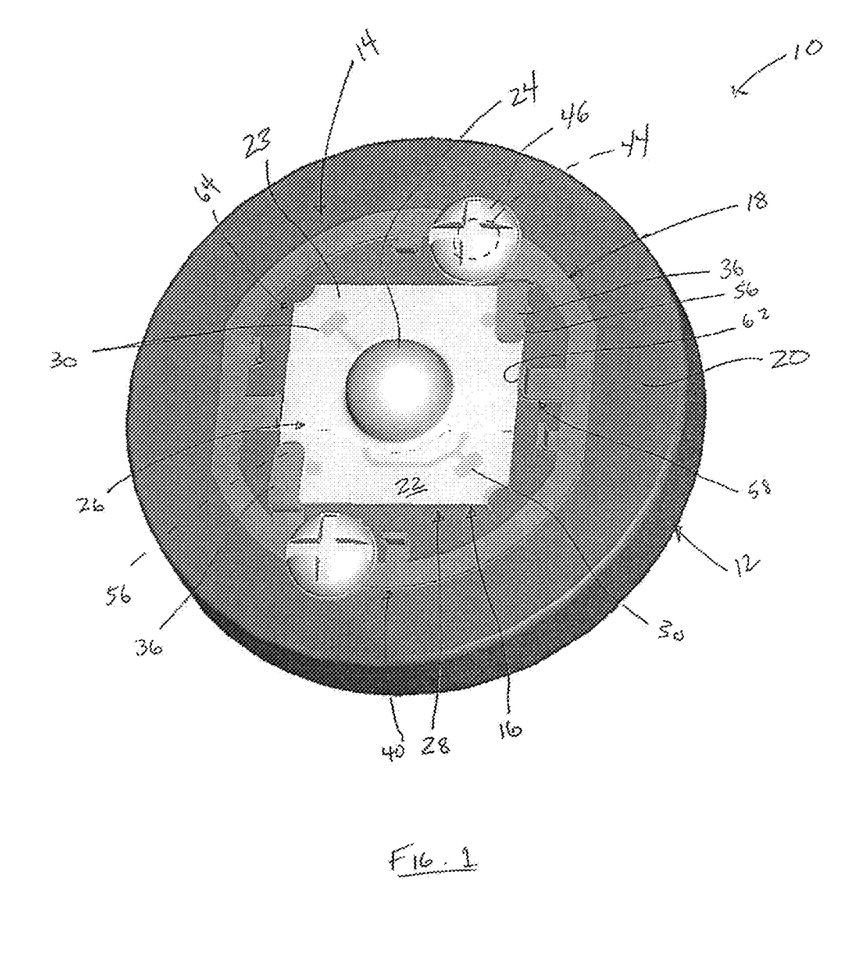
FIG. 1 is a perspective view of an exemplary embodiment of a lighting assembly.

FIG. 1 is a perspective view of an exemplary embodiment of a lighting assembly 10. The lighting assembly 10 includes a support structure 12 and a socket assembly 14 that is mounted to the support structure 12. The socket assembly 14 includes a light emitting diode (LED) package 16 and a clamp 18. As will be described in more detail below, the clamp 18 is used to hold the LED package 16 to the support structure 12. The lighting assembly 10 may be part of a light engine, a light fixture, or other lighting system that is used for residential, commercial, and/or industrial use. The lighting assembly 10 may be used for general purpose lighting, or alternatively, may have a customized application and/or end use.

The support structure 12 may be any structure to which the socket assembly 14 is capable of being mounted to, such as, but not limited to, a base, a heat sink, and/or the like. In the exemplary embodiment, the support structure 12 is a heat sink. The support structure 12 includes a mounting surface 20 to which the socket assembly 14 is mounted. Optionally, at least a portion of the mounting surface 20 is approximately flat. The support structure 12 may include one or more mounting features (e.g., the openings 44 shown in FIGS. 1, 3, and 4; the openings 244 and segments 290 shown in FIG. 6; and the recess 344 shown in FIG. 7) for mounting the socket assembly 14 to the support structure, as will be described below.

The LED package 16 includes an LED printed circuit board (PCB) 22 with an LED 24 mounted thereto. In the exemplary embodiment, a single LED 24 is mounted to the LED PCB 22, however, any number of LEDs 24 may be mounted to the LED PCB 22. The LED PCB 22 may be sized appropriately depending on the number of LEDs 24 mounted thereto. The LED PCB 22 includes opposite sides 26 and 28. The LED 24 is mounted on the side 26 of the LED PCB 22. The LED package 16 includes one or more power pads 30 on the LED PCB 22.

In the exemplary embodiment, the LED package 16 is what is commonly referred to as a "chip-on-board" (COB) LED. But, the LED package 16 may be any other type of LED package, such as, but not limited to, an LED package that includes an LED PCB and one or more LEDs soldered to the LED PCB. The LED PCB 22 includes a rectangular shape in the exemplary embodiment. But, the LED PCB 22 may additionally or alternatively include any other shape, which may depend on the type and/or number of LEDs 24 mounted to the LED PCB 22. A substrate 23 of the LED PCB 22 may be fabricated from any materials, such as, but not limited to, a ceramic, polytetrafluoroethylene, FR-4, FR-1, CEM-1, CEM-3, FR-2, FR-3, FR-5, FR-6, G-10, CEM-2, CEM-4, CEM-5, an insulated metal substrate (IMS) and/or the like.

Figure 2:
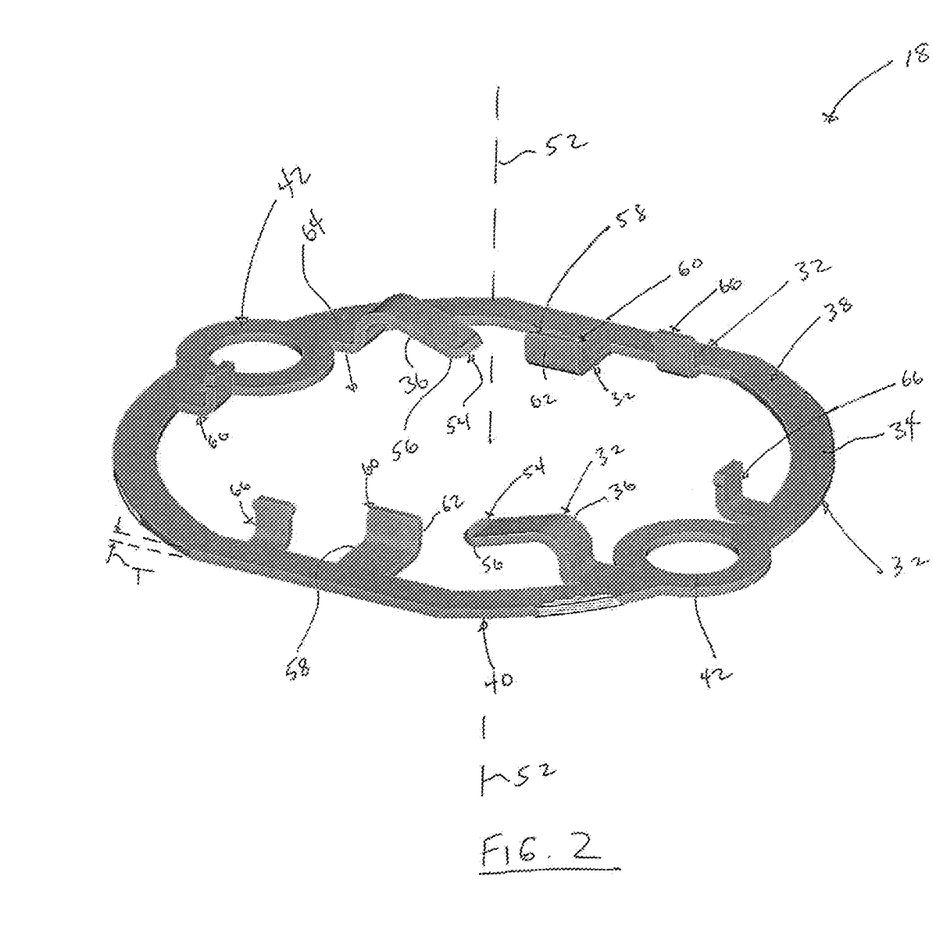
FIG. 2 is a perspective view of an exemplary embodiment of a clamp of the lighting assembly shown in FIG. 1.
Figure 3:
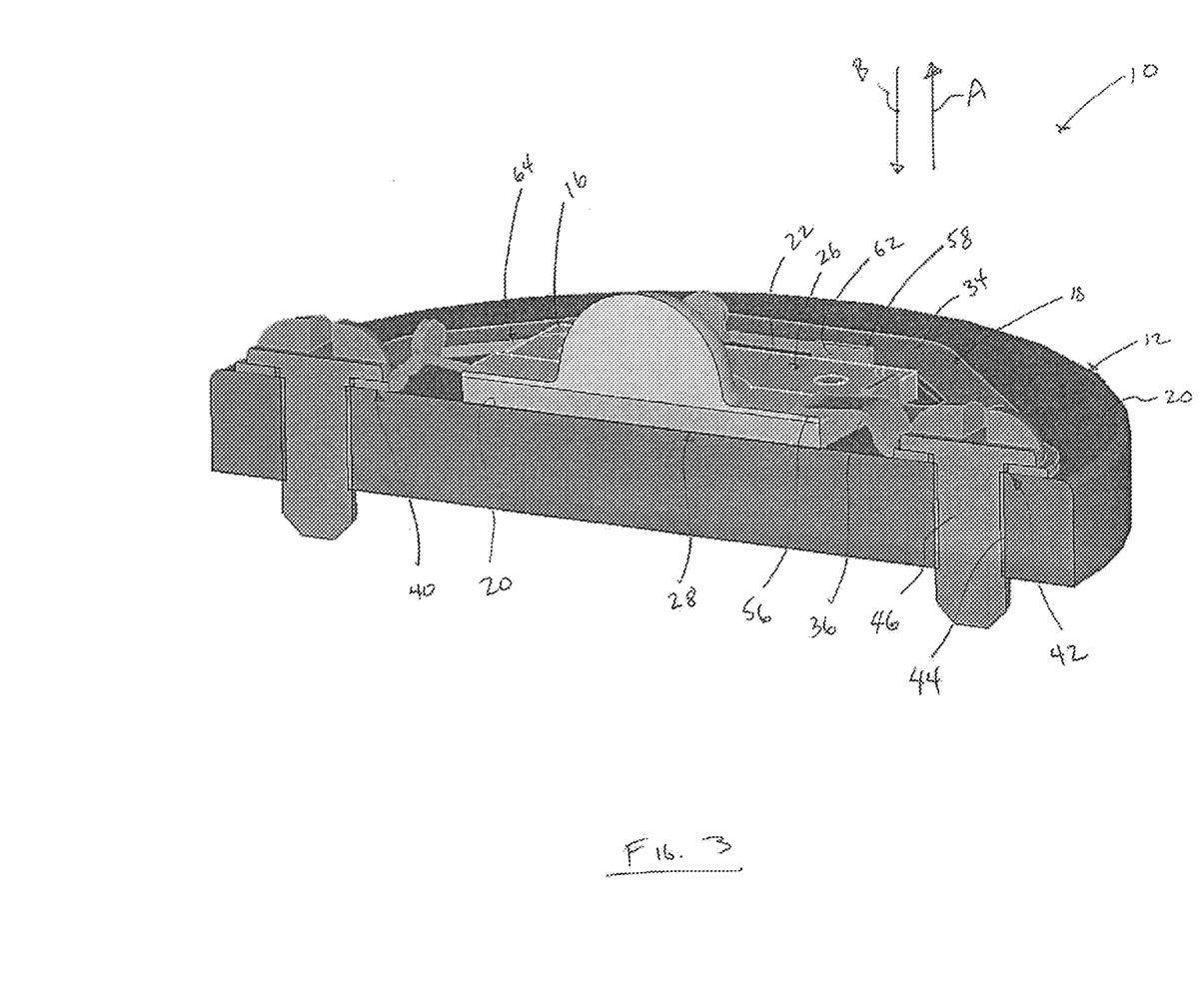
FIG. 3 is a perspective view illustrating a cross section of the lighting assembly shown in FIG. 1.
Figure 4:
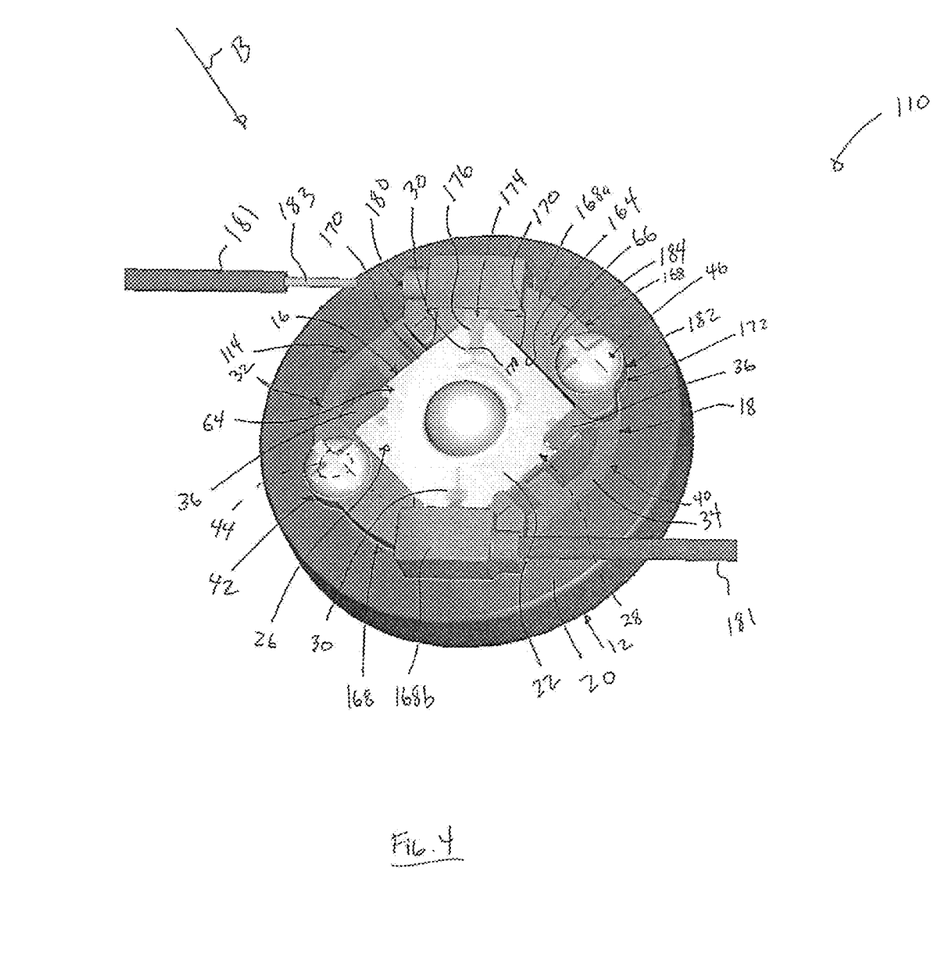
FIG. 4 is a perspective view of another exemplary embodiment of a lighting assembly.

FIG. 2 is a perspective view of an exemplary embodiment of the clamp 18 of the socket assembly 14. The clamp 18 includes a body 32, which includes a base 34 and one or more spring fingers 36 that extend from the base 34. As will be described below, the spring finger 36 is configured to engage the LED package 16 (FIGS. 1, 3, 4, 6, and 7) to apply a clamping force to the LED PCB 22 (FIGS. 1, 3, and 4) to hold the LED package 16 to the support structure 12 (FIGS. 1, 3, and 4).

The base 34 is configured to be mounted to the support structure 12. In the exemplary embodiment, the base 34 is configured to be mounted on the mounting surface 20 (FIGS. 1, 3, and 4) of the support structure 12. The base 34 includes opposite sides 38 and 40. The base 34 extends a thickness T between the sides 38 and 40, and specifically from the side 38 to the side 40 (and vice versa). In the exemplary embodiment, the side 40 of the base 34 engages the mounting surface 20 of the support structure 12 when the base 34 is mounted to the support structure 12.

The body 32 of the clamp 18 may include one or more mounting members 42 that are used to mount the clamp 18 to the support structure 12. Each mounting member 42 cooperates with a corresponding mounting feature (e.g., the openings 44 shown in FIGS. 1, 3, and 4; the openings 244 and segments 290 shown in FIG. 6; and the recess 344 shown in FIG. 7) of the support structure 12 to mount the clamp 18 to the support structure 12, as will be described below. The clamp 18 may include any number of the mounting members 42, each of which may be any type of mounting member. In the exemplary embodiment, the base 34 includes two mounting members 42, which are openings that are configured to receive a fastener (e.g., the fastener 46 shown in FIGS. 1, 3, and 4) therethrough. But, each of the mounting members 42 may additionally or alternatively be any other type of mounting member, such as, but not limited to, a post, a latch, a spring, a snap-fit member, an interference-fit member, a rivet, a pop rivet, a threaded fastener, and/or the like. Examples of other types of mounting members are described below with respect to the mounting members 242 and 342 shown in FIGS. 6 and 7, respectively.

The base 34 optionally includes a ring structure having a central axis 52. Specifically, the ring structure of the base 34 extends around the central axis 52 and the base 34 extends the thickness T along the central axis 52. The ring structure of the base 34 is configured to extend at least partially around the circumference of the LED PCB 22. As used herein, a "ring structure" means a structure that extends at least partially (e.g., may or may not be continuous) around a central axis and that includes a curved segment. As can be seen in FIG. 2, in the exemplary embodiment, the ring structure of the base 34 is a continuous structure that extends completely around the central axis 52. Alternatively, the ring structure of the base 34 is not a continuous structure such that the ring structure of the base 34 extends only partially around the central axis 52. The exemplary embodiment of the ring structure of the base 34 includes curved segments and straight segments. Alternatively, the ring structure of the base 34 is a single curved segment. Examples of other possible ring structures of the base 34 include, but are not limited to, a circular shape, an oval shape, an elliptical shape, and/or the like. The base 34 is not limited to having a ring structure, but rather may additionally or alternatively include any other shape that enables the clamp 18 to function as described and/or illustrated herein. Examples of other shapes of the base 34 include, but are not limited to, a rectangular shape, a square shape, a quadrilateral shape, a shape having two or more sides, and/or the like. The size and/or shape of the base 34, and/or other components of the clamp 18, may depend on the size and/or shape of one or more components of the LED package 16.

As briefly described above, the body 32 of the clamp 18 includes the spring fingers 36. Although two are shown, the clamp body 32 may include any number of the spring fingers 36. Each spring finger 36 is configured to engage the LED PCB 22 to apply a clamping force to the LED PCB 22, which acts on the LED PCB 22 in a direction toward the support structure 12. Specifically, each spring finger 36 extends from the ring structure of the base 34 in a radially inward direction relative to the central axis 52. Each spring finger 36 extends a length from the base 34 to an end 54 and includes an interface 56 at which the spring finger 36 is configured to engage the LED PCB 22. In the exemplary embodiment, the end 54 of each spring finger 36 includes the corresponding interface 56, but each interface 56 may alternatively extend at any other location along the length of the corresponding spring finger 36.

The spring finger 36 is a resiliently deflectable spring that engages the side 26 (FIGS. 1, 3, and 4) of the LED PCB 22. Specifically, when the clamp 18 is used to hold the LED package 16 to the support structure 12, the interface 56 of the spring finger 36 engages the side 26 of the LED PCB 22 and is deflected thereby in a direction away from the support structure 12. In the deflected position, the spring finger 36 exerts the clamping force on the side 26 of the LED PCB 22 that acts in a direction toward the support structure 12. Various parameters of the spring fingers 36 may be selected such that the clamp 18 provides a predetermined clamping force, or range thereof, to the LED package 16. Such parameters of the spring fingers 36 include, but are not limited to, the number of spring fingers 36, the geometry (e.g., shape) of each of the spring fingers 36, the dimensions (e.g., length, width, thickness, and/or the like) of each of the spring fingers 36, the location of each of the spring fingers 36 along the base 34, the orientation of each of the spring fingers 36 relative to the base 34, the materials of each of the spring fingers 36, and/or the like. The various parameters of the spring fingers 36 may be selected to provide a predetermined clamping force, or range thereof, that facilitates preventing failure of the LED package 16.

The body 32 of the clamp 18 may include one or more of the locating members 58, which are configured to engage the LED PCB 22 to locate the LED package 16 relative to the clamp body 32. For example, the locating members 58 may center the LED PCB 22 within a recess 64 of the body 32 of the clamp 18. The clamp 18 may include any number of the locating members 58, each of which may be any type of locating member. In the exemplary embodiment, the locating members 58 are extensions that extend from the ring structure of the base 34 in a radially inward direction relative to the central axis 52. Each locating member 58 extends a length from the base 34 to an end 60. The locating members 58 include interfaces 62 at which the locating members 58 are configured to engage the LED PCB 22. The recess 64 of the clamp body 32 is defined between the interfaces 62. The recess 64 is configured to receive the LED package 16 therein. In the exemplary embodiment, the end 60 of each locating member 58 includes the interface 62, but each interface 62 may alternatively extend at any other location along the length of the corresponding locating member 58. In addition or alternatively to the extensions, one or more other types of locating members 58 may be provided. In some embodiments, the locating members 58 provide anti-rotational features that prevent rotation of the LED package 16 relative to the clamp body 32.

Figure 5:
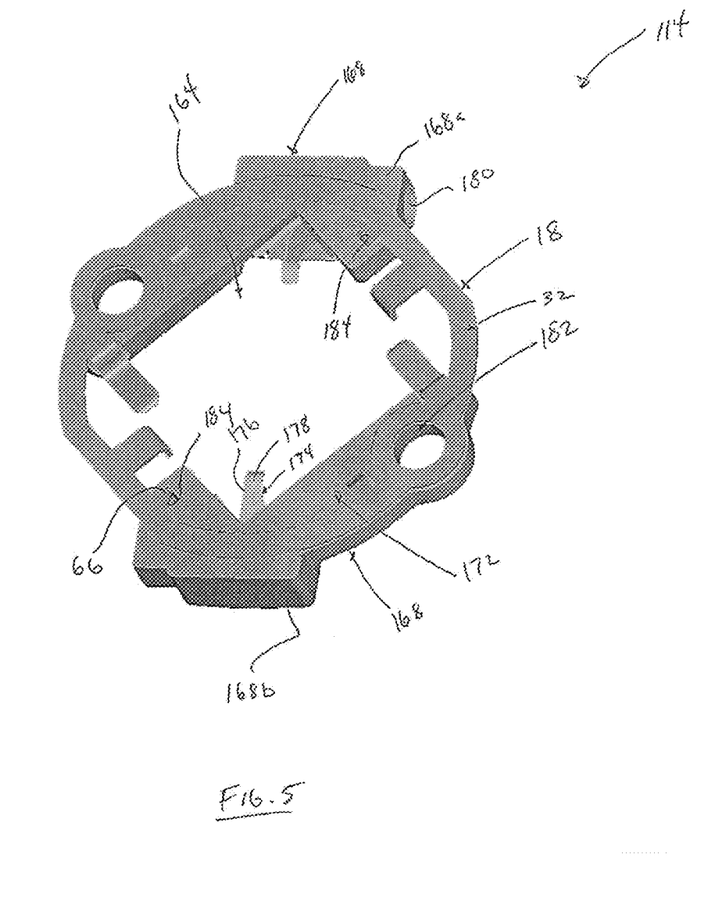
FIG. 5 is a perspective view of an exemplary embodiment of a socket assembly of the lighting assembly shown in FIG. 4.

The clamp 18 may be used with or without a housing (e.g., the housing 168 shown in FIGS. 4 and 5). In other words, the socket assembly 14 may or may not include a housing in addition to clamp 18. In the exemplary embodiment of the socket assembly 14, the socket assembly 14 does not include a housing (e.g., the housing 168) such that the clamp 18 is not used with a housing. Whether or not the clamp 18 is used with a housing (e.g., the housing 168), the body 32 of the clamp 18 optionally includes one or more retention members 66 that are configured to mechanically connect the body 32 of the clamp 18 to a housing. The clamp 18 may include any number of the retention members 66, each of which may be any type of retention member. In the exemplary embodiment, the retention members 66 are interference-fit tabs that extend from the base 34 outwardly relative to the side 38 of the base 34. Although four are shown, the body 32 of the clamp 18 may include any number of the retention members 66. Moreover, each of the retention members 66 may additionally or alternatively be any other type of retention member, such as, but not limited to, a post, a latch, a spring, a snap-fit member, another type of interference-fit member, an opening, and/or the like. In some embodiments, in addition or alternative to the retention members 66, one or more of the mounting members 42 may be used to mechanically connect the body 32 of the clamp 18 to a housing.

In some embodiments, the spring fingers 36 extend from the base 34 such that the base 34 and the spring fingers 36 define a unitary body of the clamp 18. In some embodiments, the mounting members 42, the locating members 58, and/or the retention members 66 define a unitary body with the base 34. The unitary body defined by the base 34 and the spring fingers 36 may constitute an approximate entirety of the body 32 of the clamp 18, or the unitary body defined by the base 34 and the spring fingers 36 may constitute only a portion of the clamp body 32. For example, the unitary body defined by the base 34 and the spring fingers 36 may constitute an approximate entirety of the body 32 of the clamp 18 when the mounting members 42 (if included), the locating members 58 (if included), and the retention members 66 (if included) also define a unitary body with the base 34. In such embodiments wherein the mounting members 42 (if included), the locating members 58 (if included), the retention members 66 (if included), and the spring fingers 36 define a unitary body with the base 34, the body 32 of the clamp 18 is a one-piece body. Moreover, and for example, the unitary body defined by the base 34 and the spring fingers 36 may constitute only a portion of the body 32 of the clamp 18 when the mounting members 42 (if included), the locating members 58 (if included), and/or the retention members 66 (if included) do not define a unitary body with the base 34.

As used herein, two or more items define a "unitary body" when the items are formed as a single continuous structure. In some embodiments, two or more items are considered to be formed as a single continuous structure if the items are incapable of being separated without damaging (such as, but not limited to, cutting through, breaking, melting, and/or the like) at least one of the items and/or a fastener that joins the items together. One example of items that are formed as a single continuous structure is two items that are integrally formed (e.g., formed from the same stamp of a sheet or reel of material). Another example of items that are formed as a single continuous structure is two items that are mechanically joined together after formation of both of the items using a mechanical fastener (e.g., an adhesive, a weld, a solder joint, and/or the like) that joins the items together such that the items are incapable of being separated without damaging at least one of the items and/or the mechanical fastener. One example of items that are not formed as a single continuous structure is two items that are mechanically joined together after formation of both of the items using a mechanical fastener (e.g., a threaded fastener, a clip, a clamp, and/or the like) that joins the items together such that the items are capable of being separated without damaging the items and the mechanical fastener.

The body 32 of the clamp 18 may be fabricated using any method, process, structure, means, and/or the like, such as, but not limited to, using a cutting process, using a casting process, using a molding process, using a forming process, and/or the like. Cutting processes include, but are not limited to, water cutting, stamping, laser cutting, punching, cutting using a saw, drill bit, plane, mill, and/or other solid cutting tool, and/or the like. Forming processes include, but are not limited to, drawing, bending, and/or the like. When the body 32 of the clamp 18 is fabricated using a cutting process, the body 32 may be cut from a reel of material, from a blank of material, from an approximately flat sheet of material, from an approximately flat material, from a rod of material, and/or the like. In some embodiments, the body 32 of the clamp 18 is a cut and formed body that is cut from a material and then formed to include the finished shape of the body 32. Moreover, in some embodiments, the spring fingers 36, the mounting members 42, the locating members 58, and/or the retention members 66 are integrally formed with the base 34.

The body 32 of the clamp 18 may be fabricated from any material(s) that enable the clamp 18 to function as described and/or illustrated herein. In some embodiments, the body 32 of the clamp 18 is metallic (e.g., one or more of the various components of the body 32 includes a metal and/or a material that exhibits similar properties to a metal). The various components of the clamp body 32 such as the base 34, the mounting members 42, the locating members 58, the retention members 66, and/or the spring fingers 36 may be fabricated from the same and/or different materials than each other. In some embodiments, the body 32 of the clamp 18 includes a material that is a relatively good thermal conductor, such that the clamp body 32 facilitates transferring heat from the LED package 16 to the support structure 12.

FIG. 3 is a perspective view illustrating a cross section of the lighting assembly 10. Referring now to FIGS. 1 and 3, the clamp 18 is shown mounted to the support structure 12 such that the clamp 18 holds the LED package 16 to the support structure 12. Specifically, the base 34 of the clamp 18 is mounted to the support structure 12 using the mounting members 42 of the clamp 18. The fasteners 46 are threaded fasteners that are received through the openings of the mounting members 42 and into the openings 44 within the support structure 12. In the exemplary embodiment, the openings 44 of the support structure 12 are threaded, such that the fasteners 46 threadably connect to the support structure 12. In addition or alternatively, a nut (not shown) is used to secure the fasteners 46 within the openings 44. When the clamp 18 is mounted to the support structure 12, the base 34 engages the support structure 12. Specifically, the side 40 of the base 34 is engaged with the mounting surface 20 of the support structure 12.

The LED package 16 is received within the recess 64 of the clamp 18 such that the interfaces 62 of the locating members 58 are engaged with the LED PCB 22. The spring fingers 36 of the clamp 18 are engaged with the LED package 16 such that the LED PCB 22 is clamped between the spring fingers 36 and the support structure 12. Specifically, the interfaces 56 of the spring fingers 36 are engaged with the side 26 of the LED PCB 22 such that the spring fingers 36 are deflected in a direction away from the support structure 12, an example of which is represented by the arrow A (not shown in FIG. 1). In the deflected positions shown in FIGS. 1 and 3, the spring fingers 36 exert the clamping force on the side 26 of the LED PCB 22 that acts in a direction toward the support structure 12, an example of which is represented by the arrow B (not shown in FIG. 1). The clamp 18 thus holds the LED package 16 to the support structure 12. The clamping force, or a range thereof, may be selected to facilitate preventing failure of the LED package 16. For example, the clamping force, or a range thereof may be selected to be sufficiently low to facilitate preventing the LED PCB 22 from fracturing (e.g., cracking, breaking, and/or the like). Moreover, and for example, the clamping force, or a range thereof, may be selected to be sufficiently high to facilitate securely holding the LED package 16 between the clamp 18 and the support structure 12 in a manner that facilitates preventing the LED package 16 from vibrating.

In the exemplary embodiment, and as best shown in FIG. 3, the side 28 of the LED PCB 22 is engaged with the mounting surface 20 of the support structure 12 when the LED package 16 is held to the support structure 12 by the clamp 18. In addition or alternatively, when the LED package 16 is held to the support structure by the clamp 18, the side 28 of the LED PCB 22 may engage an intermediate member (e.g., a thermal interface material; not shown) that extends between the LED PCB 22 and the support structure 12. The engagement between the LED PCB 22 and the support structure 12 and/or intermediate member may facilitate the transfer of heat away from the LED package 16.

As described above, in the exemplary embodiment of the socket assembly 14, the clamp 18 is not used with a housing. The power pads 30 (not visible in FIG. 3) of the LED package 16 are configured to be soldered or otherwise electrically connected to corresponding electrical wires (not shown). The electrical wires supply electrical power to the LED package 16 to drive operation of the LED 24.

FIG. 4 is a perspective view of another exemplary embodiment of a lighting assembly 110. FIG. 4 illustrates an exemplary embodiment wherein the clamp 18 is used with a housing 168. The lighting assembly 110 includes the support structure 12 and a socket assembly 114, which is mounted to the support structure 12. The socket assembly 114 includes the LED package 16, the clamp 18, and the housing 168. The clamp 18 is used to hold the LED package 16 to the support structure 12. The lighting assembly 110 may be part of a light engine, a light fixture, or other lighting system that is used for residential, commercial, and/or industrial use. The lighting assembly 110 may be used for general purpose lighting, or alternatively, may have a customized application and/or end use.

FIG. 5 is a perspective view of an exemplary embodiment of the socket assembly 114 of the lighting assembly 110. Referring now to FIGS. 4 and 5, the socket assembly 114 is configured to be mounted to the support structure 12 (not shown in FIG. 5). Specifically, both the clamp 18 and the housing 168 are configured to be mounted to the support structure 12.

The housing 168 of the socket assembly 114 includes a recess 164 that receives the LED package 16 (not shown in FIG. 5) therein. In the exemplary embodiment, the housing 168 includes two or more discrete housing segments 168a and 168b that cooperate to define the recess 164 that receives the LED package 16. Specifically, the recess 164 is defined between the housing segments 168a and 168b. In some alternative embodiments, the housing 168 includes a single continuous housing segment instead of the two or more discrete housing segments 168a and 168b. For example, the housing segments 168a and 168b may be fabricated as a single unitary body. Moreover, although two are shown, the housing 168 may include any number of discrete housing segments greater than two. The size and/or shape of the housing 168, including any housing segments thereof, may depend on the size and/or shape of one or more components of the LED package 16.

In the exemplary embodiment, the housing segments 168a and 168b do not engage each other. Alternatively, the housing segments 168a and/or 168b engage each other. Optionally, the housing segments 168a and 168b are substantially identical and/or hermaphroditic. For example, the housing segments 168a and 168b are optionally fabricated using one or more of the same molds. Optionally, the housing segments 168a and/or 168b engages one or more edge surfaces 170 (not shown in FIG. 5) of the LED PCB 22 (not shown in FIG. 5) when the LED package 16 is received within the recess 164.

Each housing segment 168a and 168b includes a mounting side 172 along which the housing segments 168a and 168b are configured to be mounted to the support structure 12. In the exemplary embodiment, the housing segments 168a and 168b each include an L-shape. But, the housing segments 168a and 168b may additionally or alternatively include any other shape(s), which may depend on the shape of one or more components of the LED package 16.

The housing segments 168a and 168b hold power contacts 174 that are configured to engage corresponding power pads 30 (not shown in FIG. 5) of the LED PCB 22. The power contacts 174 include fingers 176 that extend outwardly from the housing segments 168a and 168b into the recess 164. The fingers 176 include mating interfaces 178 at which the power contacts 174 are configured to engage the corresponding power pads 30 of the LED PCB 22. Each power contact 174 may include any number of the fingers 176, and each housing segment 168a and 168b may hold any number of the power contacts 174.

Each housing segment 168a and 168b includes one or more wire slots 180 that receives an electrical wire 181 therein. When an electrical wire 181 is received within the wire slot 180, an electrical conductor 183 of the electrical wire 181 engages the power contact 174 to establish an electrical connection between the electrical wire 181 and the power contact 174. The electrical wires 181 supply electrical power to the LED package 16 to drive operation of the LED 24. Each housing segment 168a and 168b may include any number of the wire slots 180.

In the exemplary embodiment, each power contact 174 includes a poke-in contact (not shown) wherein a stripped end of an electrical wire is poked into the poked into the power contact 174 to establish an electrical connection between the electrical wire and the power contact 174. But, any other type of mechanical connection may additionally or alternatively be used to establish the electrical connection between each power contact 174 and an electrical wire. For example, a power contact 174 may include an insulation displacement contact (IDC; not shown) that pierces the insulation of an electrical wire to electrically connect to an electrical conductor of the wire. Moreover, and for example, a power contact 174 may be crimped, welded, and/or otherwise electrically connected to the electrical conductor of an electrical wire.

The housing segments 168a and 168b may include one or more mounting members 182 for mounting the housing 168 to the support structure 12 and/or for mechanically connecting the housing 168 to a neighboring socket assembly (not shown). In the exemplary embodiment, the mounting members 182 are openings that are configured to receive a fastener (e.g., the fastener 46, which is not shown in FIG. 5) therethrough. But, each mounting member 182 may additionally or alternatively be any other type of mounting member, such as, but not limited to, a post, a latch, a spring, a snap-fit member, an interference-fit member, and/or the like. Each housing segment 168a and 168b may include any number of the mounting members 182, and the housing 168 may include any number of the mounting members 182 overall.

The housing 168 may include one or more retention features 184 for mechanically connecting the body 32 of the clamp 18 to the housing 168. Specifically, the retention features 184 of the housing cooperate with the retention members 66 of the clamp 18 to mechanically interconnect the clamp 18 and the housing 168. In the exemplary embodiment, each of the housing segments 168a and 168b includes one or more of the retention features 184. But, each housing segment 168a and 168b may include any number of the retention features 184. The housing 168 may include any number of the retention features 184 overall.

Each of the retention features 184 may be any type of retention feature. In the exemplary embodiment, the retention features 184 are openings that are configured to receive the tabs of the retention members 66 with an interference-fit. But, each of the retention features 184 may additionally or alternatively be any other type of retention feature, such as, but not limited to, a post, a latch, a spring, a snap-fit member, an interference-fit tab, and/or the like. In some embodiments, in addition or alternative to the retention features 184, one or more of the mounting members 182 may be used to mechanically interconnect the clamp body to the housing 168.

Referring now to solely to FIG. 4, the socket assembly 114 is shown mounted to the support structure 12. Specifically, both the clamp 18 and the housing 168 are mounted to the support structure 12. In the exemplary embodiment, the mounting features (e.g., the openings 44) of the support structure 12 are common to both the clamp 18 and the housing 168. Accordingly, in the exemplary embodiment, the fasteners 46 are used to mount both the housing 168 and the clamp 18 to the support structure 12. Specifically, the mounting members 42 of the clamp 18 are aligned with the mounting members 182 of the housing 168 such that the fasteners 46 extend through both the openings of the mounting members 42 and the openings of the mounting members 182. Alternatively, the mounting features of the support structure 12 are not common to both the clamp 18 and the housing 168. For example, in some alternative embodiments, the mounting members 42 of the clamp 18 are not aligned with the mounting members 182 of the housing 168 such that the clamp 18 and the housing 168 are separately mounted to the support structure 12.

The clamp 18 is optionally mechanically connected to the housing 168. Specifically, the retention members 66 of the clamp 18 cooperate with the retention features 184 of the housing 168 to mechanically interconnect the clamp 18 and the housing 168. In the exemplary embodiment, the tabs of the retention members 66 are received within the openings of the retention features 184 with an interference-fit to mechanically interconnect the clamp 18 to the housing 168. Other arrangements may additionally or alternatively be provided to mechanically interconnect the clamp 18 and the housing 168.

As can be seen in FIG. 4, the LED package 16 is received within the recesses 64 and 164 of the clamp 18 and the housing 168, respectively. The power contacts 174 that are held by the housing 168 are engaged with corresponding power pads 30 of the LED PCB 22. The clamp 18 holds the LED package 16 to the support structure 12. When the clamp 18 is mounted to the support structure 12 as shown in FIG. 4, the base 34 may engage the support structure 12. Specifically, the side 40 of the base 34 may be engaged with the mounting surface 20 of the support structure 12.

The spring fingers 36 of the clamp 18 are engaged with the LED package 16 such that the LED PCB 22 is clamped between the spring fingers 36 and the support structure 12. In the deflected positions shown in FIG. 4, the spring fingers 36 exert the clamping force on the side 26 of the LED PCB 22 that acts in a direction toward the support structure 12, an example of which is represented by the arrow B. The clamp 18 thus holds the LED package 16 to the support structure 12. The clamping force, or a range thereof, may be selected to facilitate preventing failure of the LED package 16. For example, the clamping force, or a range thereof may be selected to be sufficiently low to facilitate preventing the LED PCB 22 from fracturing (e.g., cracking, breaking, and/or the like). Moreover, and for example, the clamping force, or a range thereof, may be selected to be sufficiently high to facilitate securely holding the LED package 16 between the clamp 18 and the support structure 12 in a manner that facilitates preventing the LED package 16 from vibrating.

The clamp 18 may clamp the LED PCB 22 to the support structure 12 independently of the housing 168. For example, the housing 168 may not apply a clamping force to the LED package 16 that acts in a direction toward the support structure 12. In some embodiments, the housing 168 does not exert any force on the LED package 16, or the only force(s) exerted by the housing 168 on the LED package 16 act on the LED package 16 in a direction that is approximately perpendicular to the direction of the arrow B and/or in a direction that is away from the support structure 12. The clamp 18 may thus, in some embodiments, clamp the LED PCB 22 to the support structure 12 independently of the housing 168. In embodiments wherein the clamp 18 clamps the LED PCB 22 to the support structure 12 independently of the housing 168, the mounting arrangement between the housing 168 and the support structure 12 does not cause the housing 168 to apply a clamping force to the LED package 16 that acts in a direction toward the support structure 12. Accordingly, in embodiments wherein the clamp 18 clamps the LED PCB 22 to the support structure 12 independently of the housing 168, the clamp 18 may be considered to clamp the LED PCB 22 between the spring fingers 36 and the support structure 12 independently of the housing 168 being mounted to the support structure 12.

In the exemplary embodiment, the side 28 of the LED PCB 22 is engaged with the mounting surface 20 of the support structure 12 when the LED package 16 is held to the support structure 12 by the clamp 18. In addition or alternatively, when the LED package 16 is held to the support structure by the clamp 18, the side 28 of the LED PCB 22 may engage an intermediate member (e.g., a thermal interface material; not shown) that extends between the LED PCB 22 and the support structure 12. The engagement between the LED PCB 22 and the support structure 12 and/or intermediate member may facilitate the transfer of heat away from the LED package 16.

Figure 6:
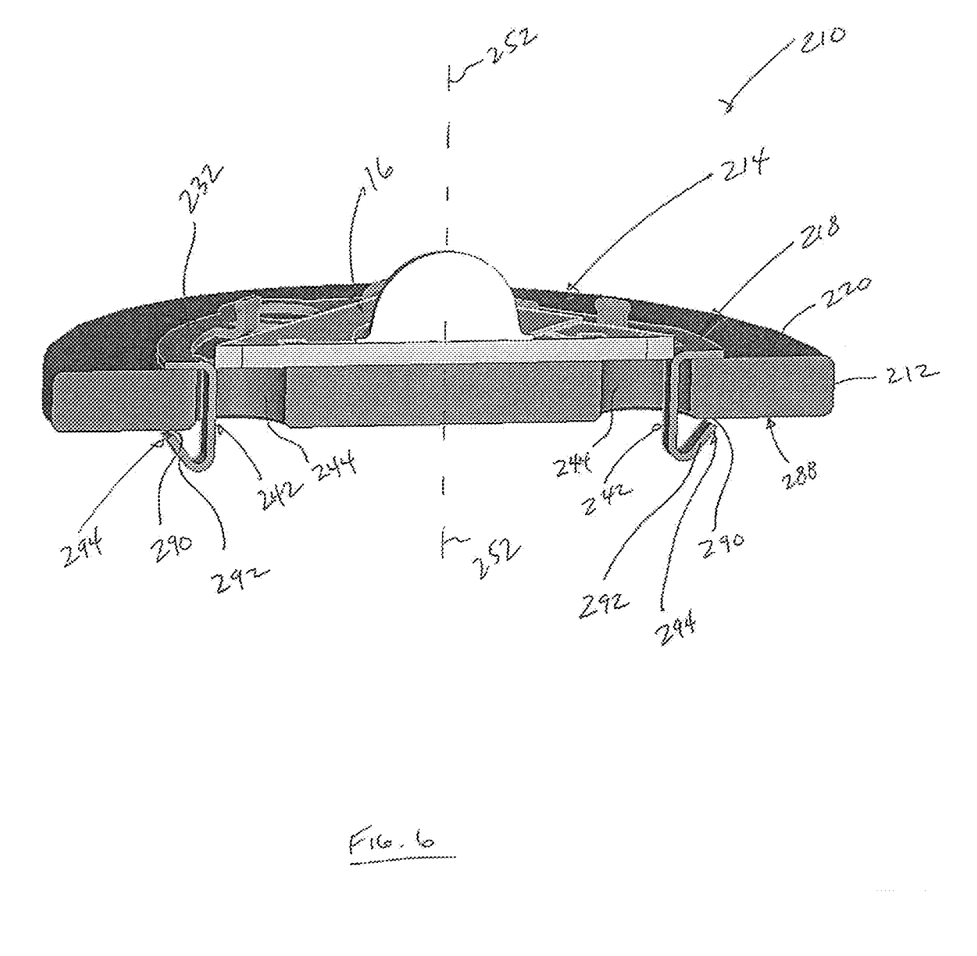
FIG. 6 is a perspective view illustrating a cross section of another exemplary embodiment of a lighting assembly.

FIG. 6 is a perspective view illustrating a cross section of another exemplary embodiment of a lighting assembly 210. FIG. 6 illustrates another exemplary embodiment of a clamp 218 that includes another exemplary embodiment of a mounting member 242 for mounting the clamp 218 to an exemplary embodiment of a support structure 212. The lighting assembly 210 includes the support structure 212 and a socket assembly 214 that is mounted to the support structure 212. The socket assembly 214 includes the LED package 16 and the clamp 218. The lighting assembly 210 may be part of a light engine, a light fixture, or other lighting system that is used for residential, commercial, and/or industrial use. The lighting assembly 210 may be used for general purpose lighting, or alternatively, may have a customized application and/or end use. The clamp 218 may be used with or without a housing (e.g., the housing 168 shown in FIGS. 4 and 5).

The support structure 212 includes a mounting surface 220 and an opposite side 288. The support structure 212 includes one or more mounting features that include openings 244 in the exemplary embodiment. The openings 244 extend through the support structure 212. The mounting features of the support structure 212 also include segments 290 of the side 288 that extend adjacent the openings 244. The support structure 212 may include any number of the mounting features.

The clamp 218 includes a body 232 having one or more of the mounting members 242, which are used to mount the clamp 218 to the support structure 212. In the exemplary embodiment, the mounting members 242 include springs 292 that are configured to cooperate with the mounting features of the support structure 212 with a snap-fit connection. Specifically, as the springs 292 are received through the openings 244 of the support structure 212, ends 294 of the springs 292 of the mounting members 242 are configured to deflect radially inward (relative to a central axis 252 of the clamp body 232) via engagement with the support structure 212. Once the ends 294 of the springs 292 have cleared the side 288 of the support structure 212, the ends 294 of the springs 292 snap radially outward (relative to the central axis 252) over the segments 290 of the support structure side 288. Engagement between the ends 294 of the springs 292 and the segments 290 holds the clamp 18 to the support structure 212. The clamp 218 may include any number of the mounting members 242.

Figure 7:
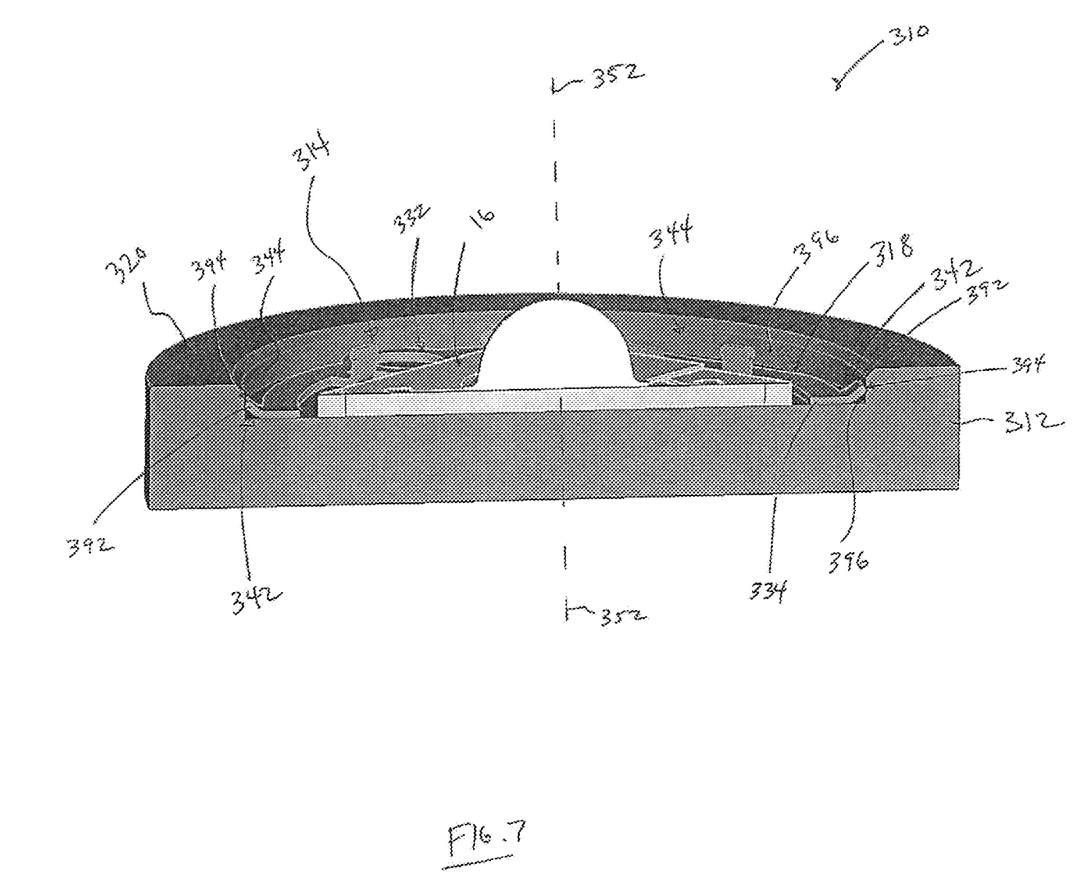
FIG. 7 is a perspective view illustrating a cross section of another exemplary embodiment of a lighting assembly.

FIG. 7 is a perspective view illustrating a cross section of another exemplary embodiment of a lighting assembly 310. FIG. 7 illustrates another exemplary embodiment of a clamp 318 that includes another exemplary embodiment of a mounting member 342 for mounting the clamp 318 to an exemplary embodiment of a support structure 312. The lighting assembly 310 includes the support structure 312 and a socket assembly 314 that is mounted to the support structure 312. The socket assembly 314 includes the LED package 16 and the clamp 318. The lighting assembly 310 may be part of a light engine, a light fixture, or other lighting system that is used for residential, commercial, and/or industrial use. The lighting assembly 310 may be used for general purpose lighting, or alternatively, may have a customized application and/or end use. The clamp 318 may be used with or without a housing (e.g., the housing 168 shown in FIGS. 4 and 5).

The support structure 312 includes a mounting surface 320 and one or more mounting features that include a recess 344 in the exemplary embodiment. The recess 344 extends into the mounting surface 320 of the support structure 312. The support structure 312 may include any number of the mounting features.

The clamp 318 includes a body 332 having a base 334 and one or more of the mounting members 342. The mounting members 342 are used to mount the clamp 318 to the support structure 312. In the exemplary embodiment, the mounting members 342 include tabs 392 that extend radially outward (relative to a central axis 352 of the clamp 318) from the base 334. The tabs 392 are configured to cooperate with the mounting feature of the support structure 312 with an interference-fit connection. Specifically, as the clamp body 332 is received into the recess 344 of the support structure 312, ends 394 of the tabs 392 engage a wall 396 of the recess 344 with an interference-fit to hold the clamp 318 to the support structure 312. The clamp 318 may include any number of the mounting members 342.

The embodiments described and/or illustrated herein may provide a socket assembly wherein an LED package is held to a support structure without failing.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A socket assembly comprising:
   a light emitting diode (LED) package having an LED printed circuit board (PCB) with an LED mounted thereto; and
   a clamp for holding the LED package to a support structure, the clamp comprising a base that is configured to be mounted to the support structure such that the base engages the support structure, the clamp further comprising a spring finger that extends from the base such that the base and the spring finger define a unitary body of the clamp, the spring finger being configured to engage the LED PCB of the LED package and apply a clamping force to the LED PCB that acts in a direction toward the support structure, wherein the clamp comprises a mounting member that is configured to cooperate with a mounting feature of the support structure with at least one of a snap-fit connection or an interference-fit connection to mount the base of the clamp to the support structure.

2. The socket assembly of claim 1, wherein the spring finger is integrally formed with the base to define the unitary body of the clamp.

3. The socket assembly of claim 1, wherein the unitary body of the clamp is metallic.

4. The socket assembly of claim 1, wherein the unitary body of the clamp is a cut and formed unitary body.

5. The socket assembly of claim 1, wherein the unitary body of the clamp comprises a recess that receives the LED package therein.

6. The socket assembly of claim 1, wherein the base comprises a ring structure having a central axis, the ring structure of the base being configured to extend at least partially around a circumference of the LED PCB, the spring finger extending from the ring structure of the base in a radially inward direction relative to the central axis.

7. The socket assembly of claim 1, wherein the clamp comprises a retention member that is configured to cooperate with a retention member of a housing such that the clamp is mechanically connected to the housing.

8. The socket assembly of claim 1, wherein the base comprises a ring structure having a central axis, the ring structure of the base being configured to extend at least partially around a circumference of the LED PCB, the clamp further comprising a locating member that extends from the ring structure of the base in a radially inward direction relative to the central axis, the locating member being configured to engage the LED PCB to locate the LED package relative to the clamp.

9. The socket assembly of claim 1, wherein the LED PCB comprises a substrate that includes a ceramic substrate.

10. A socket assembly for light emitting diode (LED) packages having an LED printed circuit board (PCB), the socket assembly comprising:
   a housing having a recess that is configured to receive an LED package therein, the housing being configured to be mounted to a support structure; and
   a clamp comprising a base that is configured to be mounted to the support structure such that the base engages the support structure, the clamp further comprising a spring finger that extends from the base, the spring finger being configured to engage the LED PCB of the LED package and apply a clamping force to the LED PCB that acts in a direction toward the support structure to clamp the LED PCB between the spring finger and the support structure independent of the housing being mounted to the support structure.

11. The socket assembly of claim 10, wherein the base of the clamp comprises a ring structure having a central axis, the ring structure of the base being configured to extend at least partially around a circumference of the LED PCB, the spring finger extending from the ring structure of the base in a radially inward direction relative to the central axis.

12. The socket assembly of claim 10, wherein the clamp comprises a mounting member that is configured to cooperate with a mounting feature of the support structure to mount the base of the clamp to the support structure.

13. The socket assembly of claim 10, wherein the clamp is mechanically connected to the housing.

14. The socket assembly of claim 10, wherein the spring finger extends from the base such that the base and the spring finger define a unitary body of the clamp.

15. The socket assembly of claim 10, wherein the spring finger is integrally formed with the base.

16. The socket assembly of claim 10, wherein the base and the spring finger define a body of the clamp, the body of the clamp being metallic.

17. The socket assembly of claim 10, wherein the clamp and the housing comprise mounting members that are aligned with each other for cooperating with a common mounting feature of the support structure to mount the clamp and the housing to the support structure.

18. A lighting assembly comprising:
   a support structure having a mounting surface; and
   a socket assembly comprising:
   a light emitting diode (LED) package having an LED printed circuit board (PCB) with an LED mounted thereto;
   a clamp for holding the LED package to the support structure, the clamp having a base that is configured to be mounted to the support structure such that the base is engaged with the mounting surface of the support structure, the clamp further comprising a spring finger that extends from the base such that the base and the spring finger define a unitary body of the clamp, the spring finger being configured to engage the LED PCB of the LED package and apply a clamping force to the LED PCB that acts in a direction toward the mounting surface of the support structure; and
   a housing having a recess that is configured to receive the LED package therein, the housing being configured to be mounted to the support structure.

* * * * *